United States Patent [19]
Takeuchi et al.

[11] Patent Number: 6,132,816
[45] Date of Patent: Oct. 17, 2000

[54] METHOD FOR PRODUCING HOMOEPITAXIAL DIAMOND THIN FILMS

[75] Inventors: Daisuke Takeuchi; Hideyo Okushi; Koji Kajimura; Hideyuki Watanabe, all of Tsukuba, Japan

[73] Assignee: Agency of Industrial Science & Technology, Ministry of International Trade and Industry, Tokyo, Japan

[21] Appl. No.: 09/175,959

[22] Filed: Oct. 21, 1998

[30] Foreign Application Priority Data

Nov. 21, 1997 [JP] Japan ............................... 9-337740

[51] Int. Cl.[7] .............................. H05H 1/24; C23C 16/26
[52] U.S. Cl. ........................................ 427/577; 427/249.8
[58] Field of Search ................... 427/577, 249.8; 117/929; 423/446

[56] References Cited

U.S. PATENT DOCUMENTS

| | | | |
|---|---|---|---|
| 5,271,971 | 12/1993 | Herb et al. | 427/577 |
| 5,308,661 | 5/1994 | Feng et al. | 427/535 |
| 5,607,723 | 3/1997 | Plano et al. | |
| 5,814,149 | 9/1998 | Shintani et al. | 117/104 |

FOREIGN PATENT DOCUMENTS

| | | |
|---|---|---|
| 0 449 571 | 10/1991 | European Pat. Off. . |
| 0 676 485 | 10/1995 | European Pat. Off. . |
| 0 699 776 | 3/1996 | European Pat. Off. . |
| 7-069790 | 3/1995 | Japan . |

OTHER PUBLICATIONS

S. D. Wolter, et al., Applied Physics Letters, vol. 66, No. 21, pp. 2810–2812, "Bias–Enhanced Nucleation of Highly Oriented Diamond on Titanium Carbide (111) Substrates", May 22, 1995.

Jong–Wan Park, et al., Japanese Journal of Applied Physics, vol. 36, No. 3A, pp. 1238–1244, "The Effects of Pretreatment, CH4 Gas Ratio and Bias Potential on the Microstructure of Microwave Plasma Enhanced Chemical Vapor Deposited Diamond Thin Films", Mar. 1997.

Primary Examiner—Roy V. King
Attorney, Agent, or Firm—Oblon, Spivak, McClelland, Maier & Neustadt, P.C.

[57] ABSTRACT

A method for producing homoepitaxial diamond thin film is provided which includes a step of effecting plasma assisted CVD with the carbon source concentration of a mixed gas of a carbon source and hydrogen set to a first low level for depositing a high-quality homoepitaxial diamond thin film on a substrate at a low film forming rate and a step of thereafter effecting the plasma assisted CVD with said carbon source concentration set to a second level higher than the first level.

3 Claims, 7 Drawing Sheets

METHOD FOR PRODUCING HOMOEPITAXIAL DIAMOND THIN FILMS

BACKGROUND OF THE INVENTION

1. Field of the Invention

This invention relates to a method and an apparatus for producing homoepitaxial diamond thin film on a substrate surface by plasma assisted CVD using a mixed gas of a carbon source and hydrogen reaction gas.

2. Description of the Prior Art

The semiconductor IC, now used widely in low-voltage applications, is increasingly being seen as also having strong potential in high-voltage power applications. This marks the advent of the power electronics era. The main factor limiting the performance of a power electronics device is the heat resistance of its material. Si, the primary material used in semiconductor development up to now, is usable only at temperatures under 200° C. On the other hand, diamond is a wide-band-gap semiconductor with excellent physical and chemical properties enabling operation even at 1000° C.

The electron structure of a crystal usually prevents electrons from assuming energies in what is referred to as the energy band gap. Unless excited by an energy such as heat or light, electrons below the band gap (in the valence band) cannot move to a high-energy state above the band gap (to the conduction band). If a substance constituting an electron source at room temperature (an n-type substance called a donor) is introduced into the semiconductor near the upper end of the band gap, conduction electrons (serving as information media in an electronic device) are supplied into conduction band. If a substance that absorbs valence electrons (a p-type substance called an acceptor) is introduced into the band gap near the valence band, holes serving as information media are supplied into the valence band. When the environment is such that electrons cross the band gap from the valence band to the conduction band to form electron-hole pairs, the electronic device cannot function (intrinsic region). The environment robustness of an electronic device is determined solely by band-gap width. The band gap of Si, the mainstay of today's semiconductor industry, is 1.11 eV. That of diamond is 5.45 eV. Therefore, Si loses its n-type or p-type property at around 300° C. but diamond can retain its n-type or p-type property even at temperatures above 1000° C. Owing to its large band gap, diamond also resists electron-hole formation by high-energy radiation. In addition, diamond's high hole mobility and small dielectric constant enable high-frequency device operation, while its high heat conductivity facilitates device miniaturization and high-density integration. Owing to its chemical stability, high heat conductivity, negative or slight electron affinity, and other properties not possessed by other electronic materials, diamond has also recently come to be seen as a promising material for the high-efficiency electron emitters used in flat panel displays. Diamond can thus be considered an ideal material for both conventional electronics applications and in all sectors of power electronics including those related to next-generation energies.

Such use of diamond thin film as a semiconductor material requires the capability to produce semiconductor-grade homoepitaxial diamond film with atomic level surface smoothness (flatness) and substantially no defects or impurities.

High-grade homoepitaxial diamond film exhibiting these qualities is known to be producible by plasma assisted CVD with the concentration of the carbon source gas set to not higher than 0.05%.

This method is not practical, however, because the film forming rate depends on the carbon source gas concentration and is 0.01 $\mu$m/h when the concentration is 0.05% or lower.

When the carbon source gas concentration is increased in an attempt to speed up film formation, the thin film formed comes to include many impurities and defects and cannot be used as a semiconductor material.

An object of the invention is to provide a method and apparatus for producing high-quality homoepitaxial diamond thin film usable as semiconductor material at a practical film forming rate.

SUMMARY OF THE INVENTION

To achieve this object, the invention provides a method for producing homoepitaxial diamond thin film by effecting plasma assisted CVD using a mixed gas of a carbon source and hydrogen as a reaction gas to deposit homoepitaxial diamond thin film on a surface of a substrate, the method comprising a step of effecting plasma assisted CVD with a carbon source concentration of the mixed gas set to a first low level for depositing a high-quality homoepitaxial diamond thin film at a low film forming rate and a step of thereafter effecting the plasma assisted CVD with said carbon source concentration set to a second level higher than the first level.

The invention further provides an apparatus for producing homoepitaxial diamond thin film by effecting plasma assisted CVD using a mixed gas of a carbon source and hydrogen as a reaction gas to deposit homoepitaxial diamond thin film on a surface of a substrate, the apparatus comprising a reaction chamber for effecting plasma assisted CVD with a carbon source concentration of the mixed gas set to a first low level for depositing a high-quality homoepitaxial diamond thin film at a low film forming rate and thereafter effecting the plasma assisted CVD with said carbon source concentration set to a second level higher than the first level, and a device connected to the reaction chamber for controlling the carbon source concentration of the mixed gas.

In this invention, when the synthesis by plasma assisted CVD is effected in a clean vacuum apparatus with the concentration of the supplied carbon source set to 0.025%–0.3% as the first concentration level, the film forming rate is 0.13 $\mu$m/h or less and a high-quality homoepitaxial diamond thin film with atomic level surface flatness is synthesized. When the carbon source concentration is thereafter changed to 0.3%–1.0% as the second concentration level, a homoepitaxial diamond thin film is formed at the rate of 0.15–0.4 $\mu$m/h with no change in the high quality of the film. In other words, the invention was accomplished based on the discovery that imparting an ideal state to the surface of the substrate during the initial phase of diamond growth enables formation of a high-quality film thereafter even if the epitaxial growth reflecting the new surface (ground surface) is increased to a high rate.

The above and other features of the present invention will become apparent from the following description made with reference to the drawings.

DESCRIPTION OF THE PREFERRED EMBODIMENTS

Figure 1:
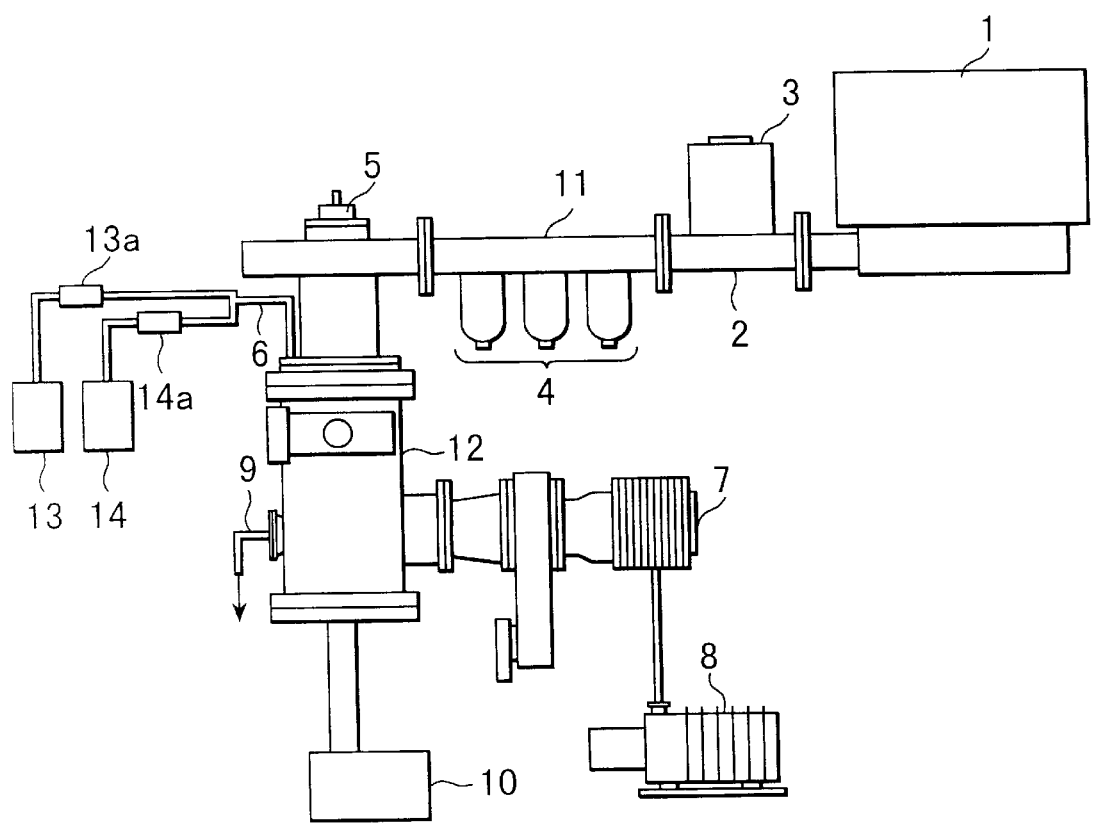
FIG. 1 is a schematic view showing an end-launch-type microwave plasma assisted CVD diamond synthesizer that is an embodiment of the apparatus for producing homoepitaxial diamond thin film according to the invention.

FIG. 1 shows an embodiment of the apparatus for producing homoepitaxial diamond thin film according to the invention. The illustrated apparatus is configured as an end-launch-type microwave plasma assisted CVD diamond synthesizer that projects microwaves normally to the surface of a substrate.

The synthesizer is equipped with a magnetron 1 whose microwave output can be regulated. Microwaves emitted by the magnetron 1 at a prescribed output power advance through a waveguide 11 toward an applicator 5. The microwaves are partially reflected back toward the magnetron 1. In order to prevent degradation of the magnetron 1, a circulator 2 for heat-absorbing only the reflected waves in a water load and a dummy load 3 are provided in the waveguide 11. The impedance of the waveguide 11 is regulated by a three-rod tuner 4 so as to suppress microwave reflection and enable all input electric power to be consumed for producing plasma. The TE01 mode microwaves advancing through the waveguide 11 are converted into concentric TM01 mode microwaves by an antenna projecting into the applicator 5 and then introduced into a reaction chamber 12. The matching of the microwaves by the conversion to TM01 mode produces a stable plasma in the cylindrical reaction chamber 12.

Carbon source gas and hydrogen gas from gas cylinders 13 and 14 pass through pressure reducing valves and mass flow controllers 13a and 14a for regulating gas flow into an inlet pipe 6 to be supplied to the reaction chamber 12 as mixed reaction gas. The mass controller for the carbon source gas is a high-precision unit enabling the carbon source content of the mixed gas to be regulated to 0.5% and lower.

A turbo pump 7 and a rotary pump 8 are operated to evacuate the interior of the reaction chamber 12 to the $10^{-8}$ Torr level. During synthesis, gas is discharged from the reaction chamber 12 by a process pump 9, the mass controllers 13a and 14a are regulated to supply the reaction chamber 12 with reaction gas composed of hydrogen gas having a carbon source concentration of 0.025%–0.3%, the substrate (not shown) is heated to a prescribed temperature by a high-frequency heater 10, and microwaves are introduced to grow a diamond thin film on the substrate surface. After a thin film has been formed on the surface of the substrate to a thickness on the order of the substrate surface roughness (peak-to-valley approx. 20 nm–200 nm), the carbon source concentration in the reaction chamber 12 is changed to 0.3%–1.0% and synthesis is continued. Although the time required to form a thin film on the substrate surface to a thickness on the order of the substrate surface roughness varies with the carbon source concentration, it falls in the range of 2–3 hours. When the carbon source concentration is initially set low to form a high-quality thin film in this manner, the film forming rate can thereafter be increased to a practical level of 0.15–0.4 $\mu$m/hr by raising the carbon source concentration to 0.3%–1.0% and the diamond thin film synthesis can be continued with no change in the high quality of the synthesized film. The principle of diamond thin film synthesis adopted is thus to impart the surface of the substrate with an ideal surface state during the initial phase of epitaxial diamond growth so as to enable unhindered formation of a high-quality film thereafter even when the epitaxial growth reflecting the new surface (ground surface) is increased to a high rate. A solid substrate of the type ordinarily used for diamond thin film formation can be used as the substrate in the invention.

Homoepitaxial diamond thin films formed according to the invention were evaluated by different measurements. The results are detailed in the following. The surface morphology of the films was evaluated using an optical microscope and an atomic force microscope (AFM). Perfection of the synthesized crystal was evaluated by cathodoluminescence (CL) spectroscopy. The film forming rate was calculated from the film thickness and synthesis time and the growth pattern at low concentration was studied with reference to the surface morphology evaluation.

First, film grown without varying the carbon source content of the reaction gas was evaluated. The result of this evaluation was then used to study the effect of growing film by the invention method of changing the reaction gas composition in the course of the synthesis. High-purity methane ($CH_4$) gas was used as the carbon source. Any of various other commonly used carbon-containing gases having O and/or H in their molecules can also be used as the carbon source. Such gases include $CO_2$, $CO$, $C_2H_2$, $C_2H_5$, $CH_3OH$ and $C_2H_5$. All film synthesis was conducted at a substrate temperature of 800° C., a supplied gas pressure of 25 Torr and a microwave power of 750 W. The substrate position was maintained constant.

Figure 2:
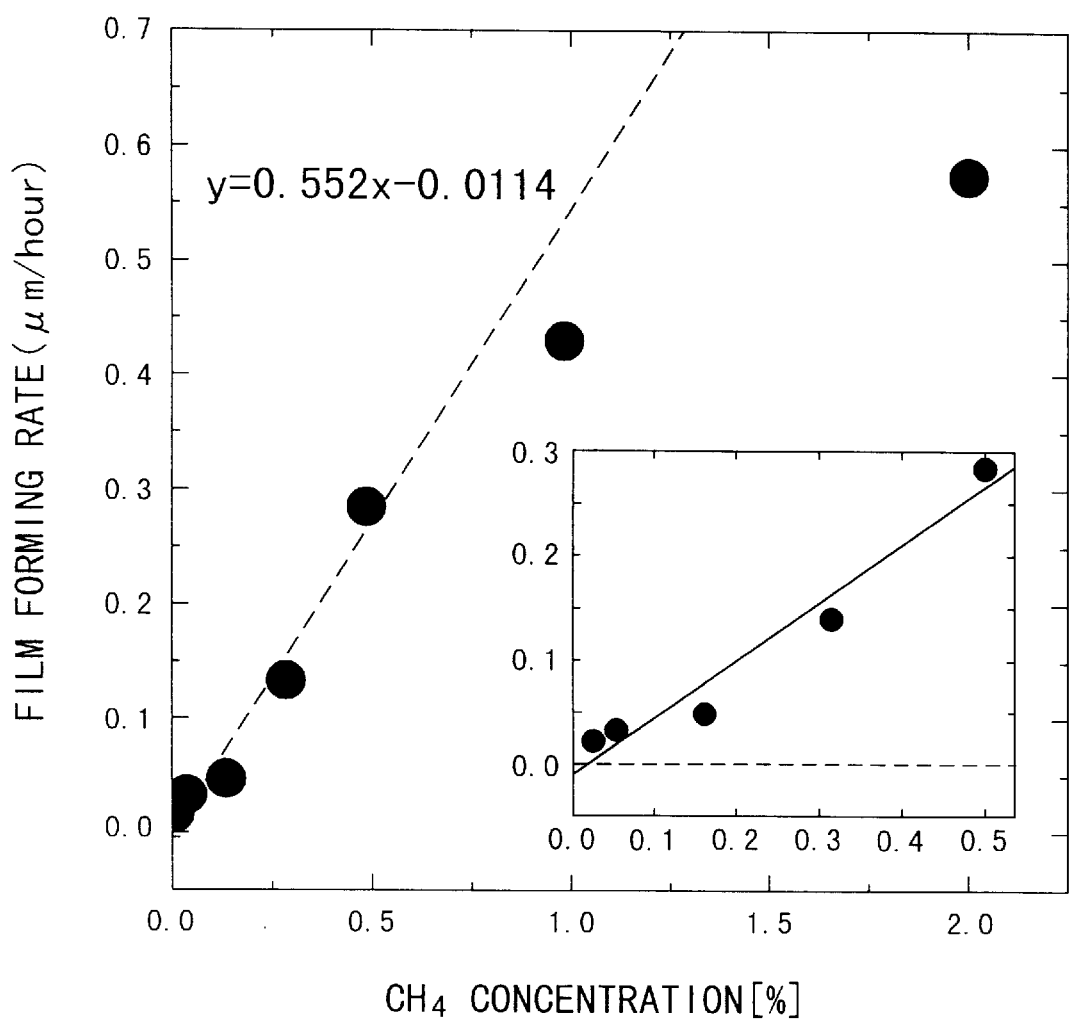
FIG. 2 is a graph showing the supplied carbon source concentration dependence of synthetic diamond thin film forming rate.

The methane concentration dependence of the thin film growth rate was examined using a tracing-probe step gage. The results are shown in FIG. 2. The insert in FIG. 2 is an enlargement of the low-concentration region. The horizontal axis is scaled for methane concentration and the vertical axis for film forming rate. It will be noted that in the low-concentration region the film forming rate depends heavily on the supplied carbon source concentration. It will also be noted that the film forming rate does not pass through the origin of the graph but becomes negative at a carbon source concentration of 0%. In other words, a solely hydrogen plasma produces etching. Published reports regarding hydrogen plasma etching point out that, among other issues, it experiences difficulty in controlling surface morphology and increases surface roughness over long etching periods.

As the film forming rate is substantially directly proportional to the supplied carbon source concentration in the concentration range between 0.025% and 0.5%, this range can be seen to be a supply-controlled region in which diamond growth varies directly with the amount of methane supplied. It is considered to be a region in which a single growth pattern prevails.

On the other hand, in the methane concentration region exceeding 0.5%, the increase in film forming rate with increase in concentration slows and deviates from proportional (supply-controlled) to shift downward (diffusion-controlled). Here the diamond growth proceeds preferentially in unepitaxial mode and constituents other than diamond (graphite and other amorphous substances) are incorporated to degrade film quality.

Next, the total gas flow rate was set at 400 SCCM and diamond thin films were grown on substrates by conducting plasma assisted CVD for 6 h at methane gas concentrations of 0.5%, 0.3% and 0.05%, all of which fall in the supply-controlled region.

Figure 3A:
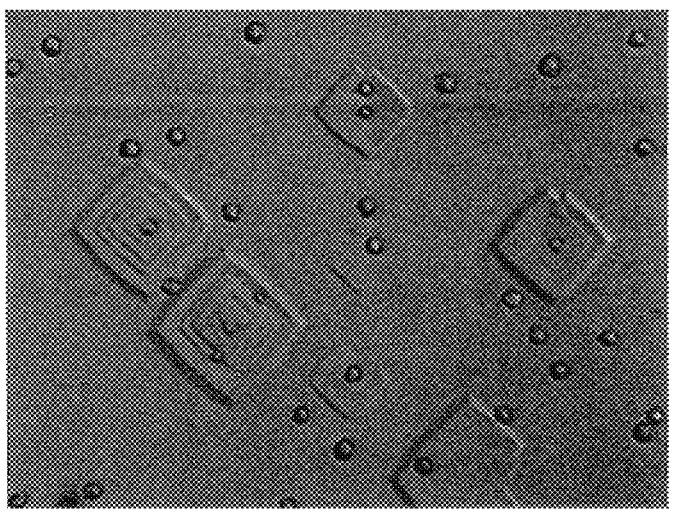
FIG. 3 shows optical micrographs of synthetic diamond film surfaces obtained at different carbon source concentrations, FIGS. 3(a), 3(b) and 3(c) showing surfaces obtained at carbon source concentrations of 0.5%, 0.3% and 0.05%, respectively.
Figure 3B:
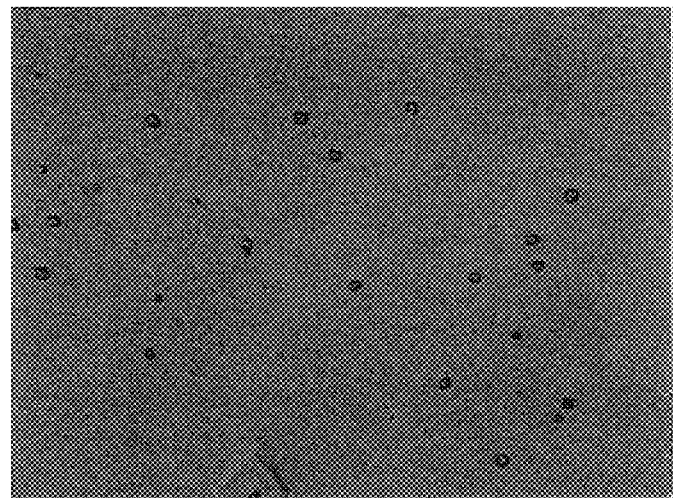
Figure 3C:

FIGS. 3(a), 3(b) and 3(c) are optical micrographs showing the surface morphologies obtained at methane source concentrations of 0.5%, 0.3% and 0.05%, respectively.

As seen in FIG. 3(a), unepitaxial crystallites and growth hillocks occurred in the thin film grown at 0.5% concentration. As seen in FIG. 3(b), the surface morphology of the thin film grown at 0.3% concentration showed macrobunching running parallel to the [110] direction, indicating that the film was grown by step-flow. Unepitaxial crystallites can also be observed but at a lower density than in the film grown at 0.5% concentration. As seen in FIG. 3(c), the thin film grown at 0.05% concentration exhibited a flatter surface morphology with no microbunching, unepitaxial crystallites or growth hillocks. The surface morphologies of these films did not change when the growth period was extended beyond 6 h.

Figure 4A:
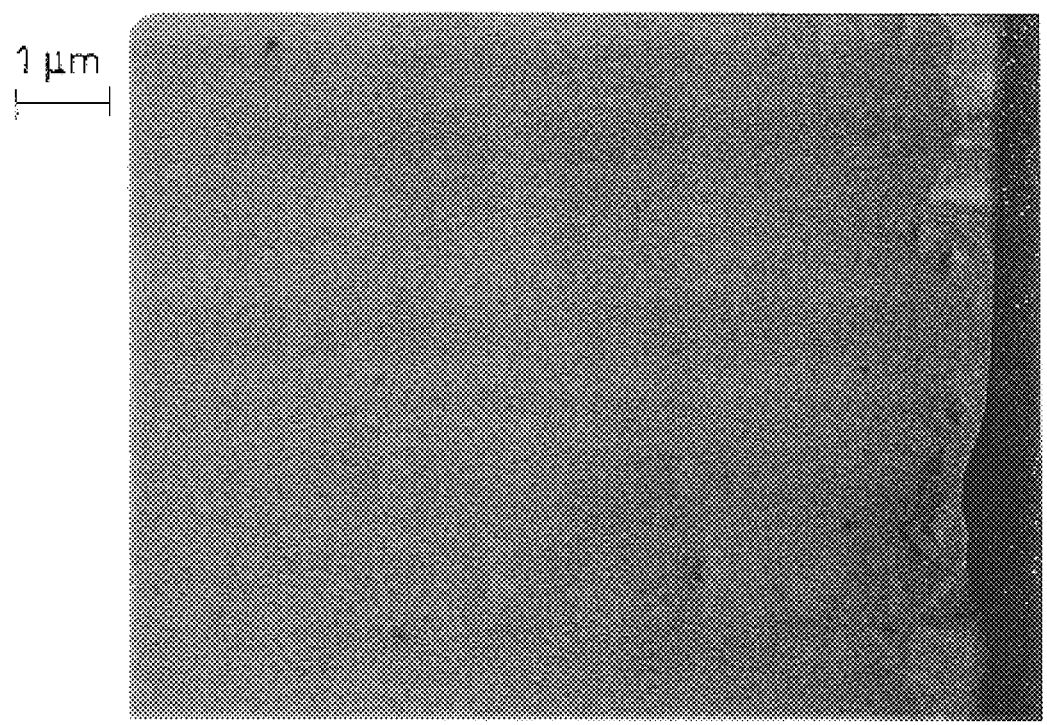
FIG. 4(a) is an optical micrograph and FIG. 4(b) is an atomic force microscope (AFM) image of the surface of a diamond film grown over 42 h at a carbon source concentration of 0.025%.
Figure 4B:
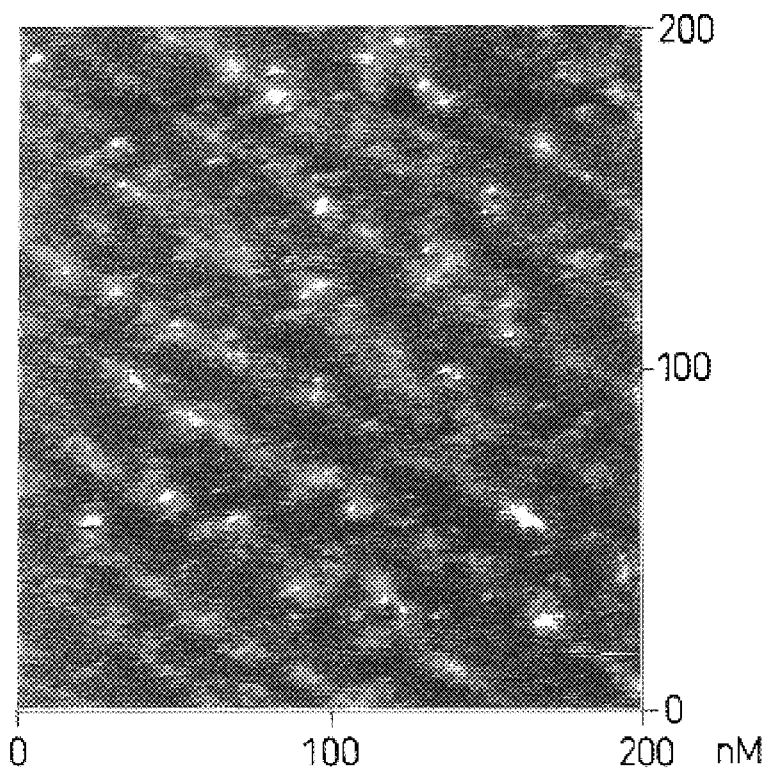

FIG. 4(a) is an optical micrograph and FIG. 4(b) is an atomic force microscope (AFM) image of a diamond thin film grown over 42 h at a carbon source concentration of 0.025%. FIG. 4(a) shows the surface morphology to be extremely flat. From FIG. 4(b), in which steps are observable at the atomic level, it can be concluded that the diamond growth was under step-flow mode control. In step-flow growth, thin film growth occurs only from the atomic level step edge and proceeds epitaxially to reflect the substrate surface structure and produce a large single-crystal region with high atomic level flatness (sometimes covering the whole substrate). It is therefore a growth mode that produces excellent thin films suitable for electronic devices.

Figure 5:
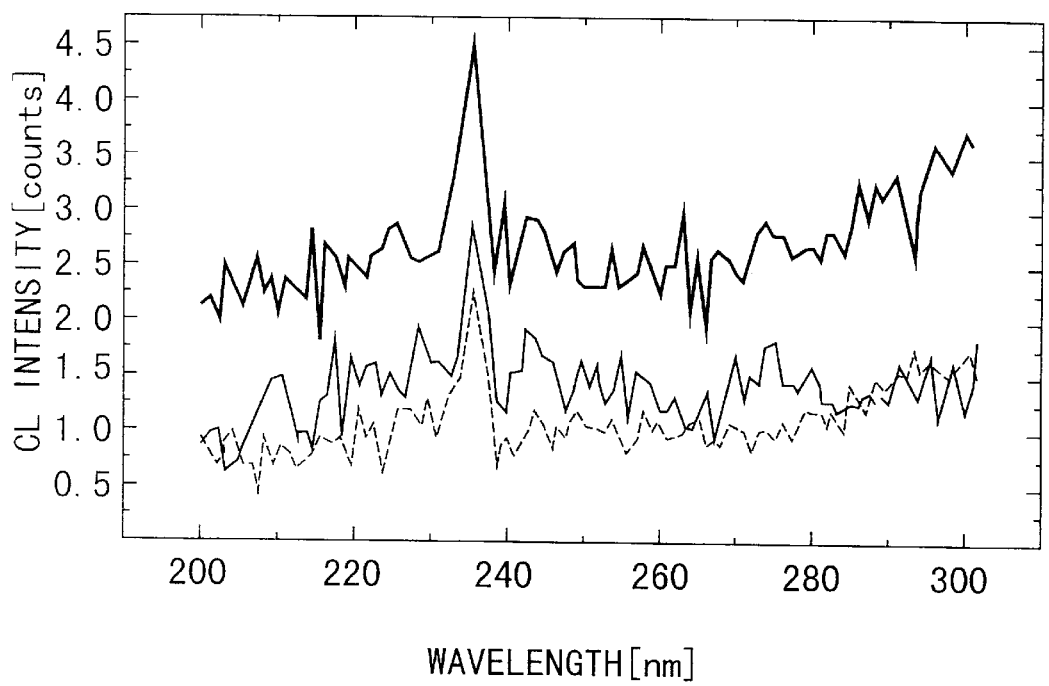
FIG. 5 shows the ultraviolet region cathodoluminescence (CL) spectra of synthetic diamond films formed at carbon source concentrations of 0.15%, 0.3% and 0.05%.

FIG. 5 shows the ultraviolet region cathodoluminescence (CL) spectra of synthetic diamond films formed at carbon source concentrations of 0.15% (thin-line curve), 0.3% (medium) and 0.05% (thick). The emission at 235 nm is near-band-gap emission (exitonic emission) associated with the 5.45 eV energy band gap of diamond. Near-band-gap emission at room temperature is a direct indication of high film quality. When impurities and/or defects and the like are present in the film, emission in the band gap is impeded by the appearance of recombination centers and no near-band-gap emission (visible and/or infrared emission) is obtained. The results obtained therefore indicate that the synthetic diamond films grown by plasma assisted CVD at low methane concentrations of 0.3% and below were of outstandingly good quality.

Although it was confirmed that homoepitaxial diamond thin film of excellent quality can be obtained by lowering the methane concentration to 0.3% or below, the film forming rate under such condition is no more than 0.13 $\mu$m/h, which impractically slow. When the methane concentration is 0.025% or lower, the film forming rate falls to a totally impractical level around 0.02 $\mu$m/h.

This invention was accomplished based on the thinking that since it was found that an ideal homoepitaxial diamond surface can be obtained by synthesis at a low carbon source concentration, it should be possible to form a high-quality diamond thin film by thereafter effecting epitaxial growth on the ideal surface. When this idea was tested, it was found that a high-quality homoepitaxial diamond thin film can be formed at a practical film forming rate by, in the first stage, carrying out synthesis at a low carbon source concentration of 0.025%–0.3% and, in the second stage, carrying out the synthesis with the supplied carbon source concentration increased to 0.3%–1.0%.

Figure 6A:
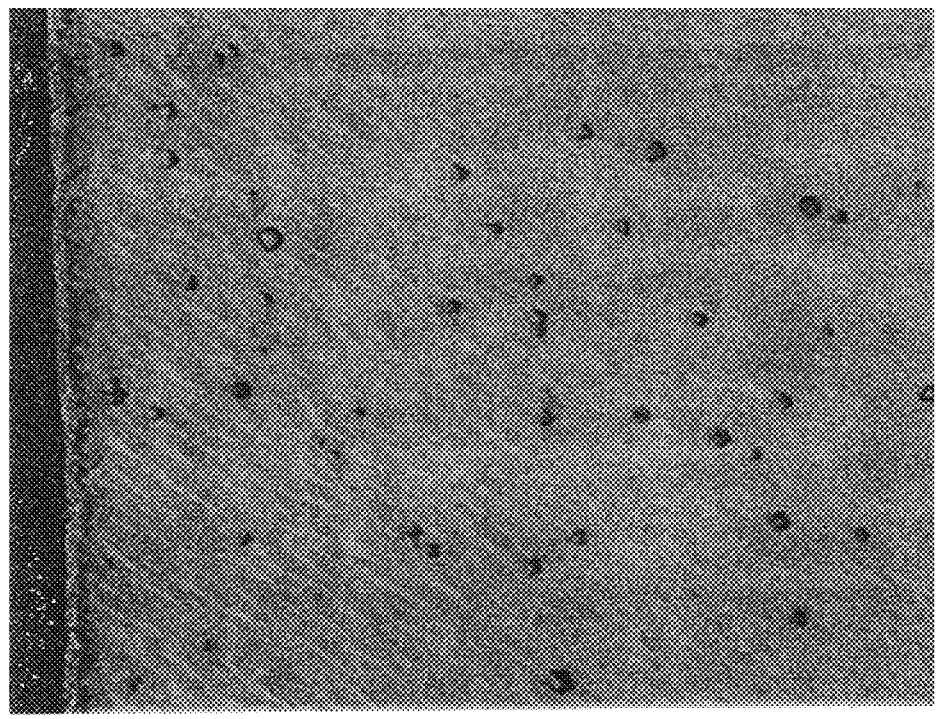
FIG. 6(a) is an optical micrograph of the surface of diamond thin film first grown at a carbon source concentration of 0.05% and thereafter grown at a carbon source concentration of 0.5%.
Figure 6B:
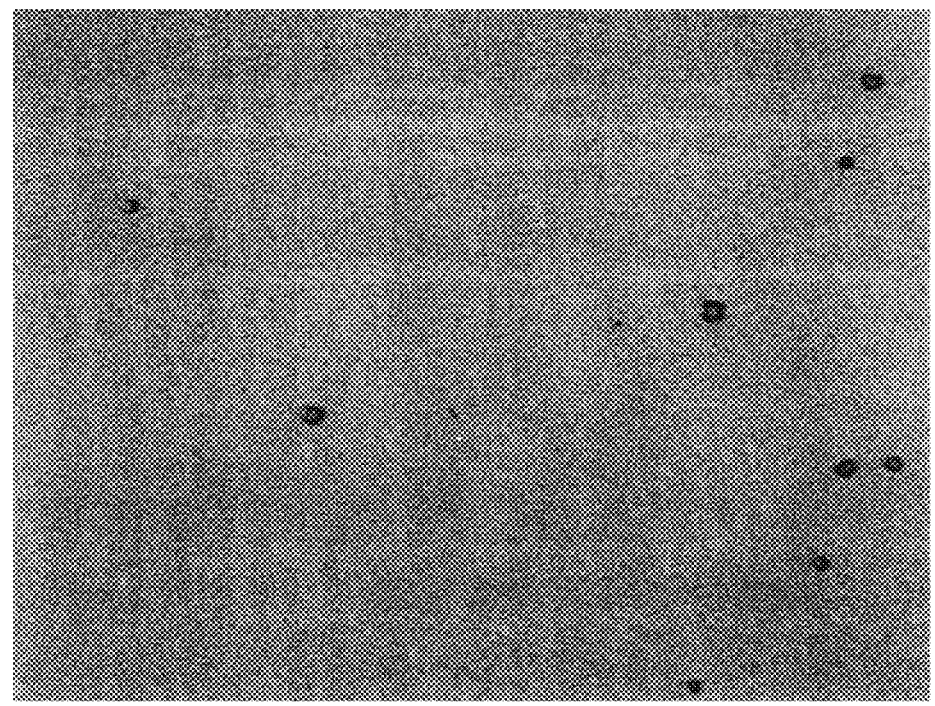
FIG. 6(b) is an optical micrograph of the surface of diamond thin film first grown at a carbon source concentration of 0.05% and thereafter grown at a carbon source concentration of 0.3%.

FIG. 6(a) is an optical micrograph of a diamond thin film first grown for 3 h at a methane concentration of 0.05% and thereafter grown for 6 h at a methane concentration of 0.5%. FIG. 6(b) is an optical micrograph of a diamond thin film first grown at a methane concentration of 0.05% for 3 h and thereafter grown at a methane concentration of 0.3% for 6 h. It can be seen that in either case the synthesis produced a flat diamond thin film having few growth hillocks and unepitaxial crystallites.

Figure 7:
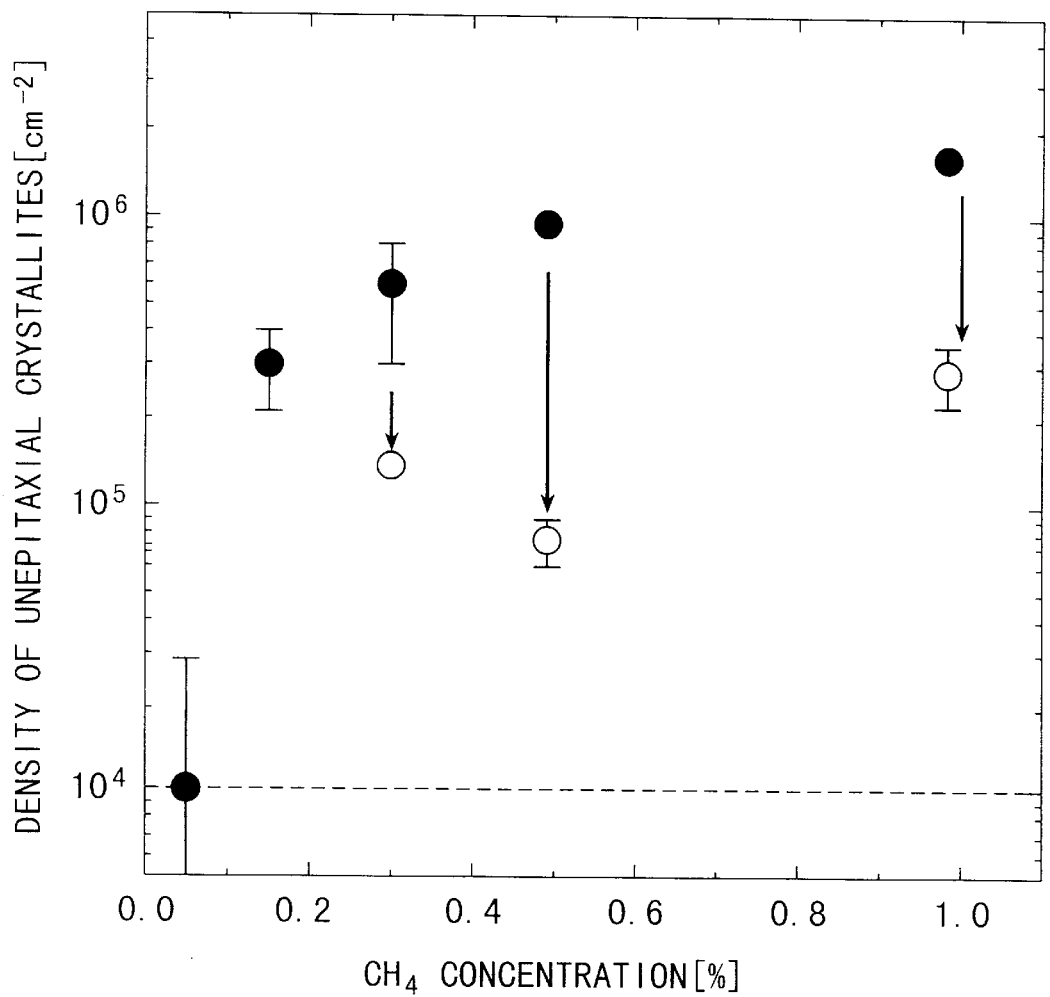
FIG. 7 is a graph showing how the density of unepitaxial crystallites of a diamond thin film synthesized by the invention method varies with carbon source concentration.

In the graph of FIG. 7, the empty circles indicate the density of unepitaxial crystallites in films obtained according to the invention by first conducting synthesis for 3 h at a methane concentration of 0.05% and thereafter conducting synthesis for 6 h with the methane concentration changed to 0.3%, 0.5% and 1.0%.

The solid circles in FIG. 7 indicate the density of unepitaxial crystallites in films produced for comparison by conducting synthesis for 6 h at unchanged methane concentrations of 0.05%, 0.15%, 0.3%, 0.5%, 1.0% and 1.8%.

This graph shows that the unepitaxial crystallite density of the film first grown at a methane concentration of 0.05% and then grown at a methane concentration of 0.5% is more than an order of ten lower (better) than that of the film grown throughout at a methane concentration of 0.5%.

At an unepitaxial crystallite density on the order of $10^4$ per 1 $cm^2$, the probability of a given 100 $\mu$m square area including an unepitaxial crystallite is around fifty-fifty. This is far lower than the unepitaxial crystallite density by conventional diamond synthesis methods. The thickness of the films grown according to the invention were substantially the same as those of the films grown for 6 h at unchanged methane concentrations of 0.5% and 0.3%. These results demonstrate that the first stage process of effecting synthesis at a low carbon source concentration of 0.025%–0.3% makes it possible to obtain an excellent surface morphology with a very low density of unepitaxial crystallites even when the film forming rate is thereafter increased to a high level by changing the carbon source concentration to 0.3%–0.5%. The cathodoluminescence (CL) spectra obtained for the invention thin films exhibited near-band-gap emission at room temperature.

In the production of homoepitaxial diamond thin film by effecting plasma assisted CVD using a mixed gas of a carbon source and hydrogen as a reaction gas to deposit homoepitaxial diamond thin film on a surface of a substrate, this invention enables production of high-quality homoepitaxial diamond thin film at a high film forming rate by effecting plasma assisted CVD with the carbon source concentration of the mixed gas set to a first low level for depositing a high-quality homoepitaxial diamond thin film at a low film forming rate and thereafter effecting the plasma assisted CVD with the carbon source concentration set to a second level higher than the first level. The growth of the diamond film at the low (0.025%–0.3%) carbon source concentration produces a diamond thin film with atomic level surface flatness throughout. When synthesis is thereafter conducted on this diamond thin film at a high carbon source concentration (0.3%–1.0%), unepitaxial growth such as of crystallites and growth on hillocks and other terraces is suppressed.

What is claimed is:

1. A method for producing a homoepitaxial diamond thin film by effecting plasma assisted CVD using a mixed gas of a carbon source and hydrogen as a reaction gas to deposit the homoepitaxial diamond thin film on a surface of a substrate, the method comprising the steps of:

effecting the plasma assisted CVD with a carbon source concentration of the mixed gas set to a first level in the range of 0.025% to 0.3% for depositing a high-quality homoepitaxial diamond thin film at a film forming rate of 0.13 $\mu$m/h or less; and thereafter effecting the plasma assisted CVD with said carbon source concentration set to a second level higher than said first level and in the range of 0.3% to 1.0% wherein said homoepitaxial diamond thin film exhibits near-band-gap emission at room temperature.

2. The method according to claim 1, wherein the carbon source is methane gas.

3. The method according to claim 1, wherein the carbon source concentration is set to the second level after a homoepitaxial diamond thin film has been formed on the surface of the substrate to a thickness on the order of the substrate surface roughness.

* * * * *